United States Patent
Arunasalam

(10) Patent No.: US 8,956,884 B2
(45) Date of Patent: Feb. 17, 2015

(54) PROCESS FOR RECONDITIONING SEMICONDUCTOR SURFACE TO FACILITATE BONDING

(75) Inventor: Parthiban Arunasalam, Austin, TX (US)

(73) Assignee: DunAn Microstaq, Inc., Austin, TX (US)

(*) Notice: Subject to any disclaimer, the term of this patent is extended or adjusted under 35 U.S.C. 154(b) by 0 days.

(21) Appl. No.: 13/574,347

(22) PCT Filed: Jan. 26, 2011

(86) PCT No.: PCT/US2011/022565
§ 371 (c)(1),
(2), (4) Date: Jul. 20, 2012

(87) PCT Pub. No.: WO2011/094302
PCT Pub. Date: Aug. 4, 2011

(65) Prior Publication Data
US 2012/0295371 A1    Nov. 22, 2012

Related U.S. Application Data

(60) Provisional application No. 61/299,334, filed on Jan. 28, 2010.

(51) Int. Cl.
*H01L 21/00* (2006.01)
*H01L 21/302* (2006.01)
(Continued)

(52) U.S. Cl.
CPC .......... *H01L 21/302* (2013.01); *B81C 1/00611* (2013.01); *H01L 21/02057* (2013.01); *B81C 2201/0121* (2013.01); *B81C 2203/036* (2013.01)
USPC ................... 438/4; 134/1.3; 257/E21.228

(58) Field of Classification Search
CPC ................ B81C 1/00611; B81C 2201/0121; H01L 21/302; H01L 21/02057
See application file for complete search history.

(56) References Cited

U.S. PATENT DOCUMENTS

| 668,202 A | 2/1901 | Nethery |
| 886,045 A | 4/1908 | Ehrlich et al. |

(Continued)

FOREIGN PATENT DOCUMENTS

| DE | 2215526 | 10/1973 |
| DE | 2930779 | 2/1980 |

(Continued)

OTHER PUBLICATIONS

B.E. Deal and A.S. Grove, General relationship for the thermal Oxidation of Silicon, 1965, Journal of Applied Physics, 36, 3770.*

(Continued)

*Primary Examiner* — Reema Patel
*Assistant Examiner* — Syed Gheyas
(74) *Attorney, Agent, or Firm* — MacMillan, Sobanski & Todd, LLC

(57) ABSTRACT

A non-abrading method to facilitate bonding of semiconductor components, such as silicon wafers, that have micro structural defects in a bonding interface surface. In a preferred method, micro structural defects are removed by forming an oxide layer on the bonding interface surface to a depth below the level of the defect, and then removing the oxide layer to expose a satisfactory surface for bonding, thereby increasing line yield and reducing scrap triggers in fabrication facilities.

11 Claims, 2 Drawing Sheets

(51) Int. Cl.
  *B81C 1/00* (2006.01)
  *H01L 21/02* (2006.01)

(56) References Cited

U.S. PATENT DOCUMENTS

| | | | |
|---|---|---|---|
| 1,886,205 A | 11/1932 | Lyford | |
| 1,926,031 A | 9/1933 | Boynton | |
| 2,412,205 A | 12/1946 | Cook | |
| 2,504,055 A | 4/1950 | Thomas | |
| 2,651,325 A | 9/1953 | Lusignan | |
| 2,840,107 A | 6/1958 | Campbell | |
| 2,875,779 A | 3/1959 | Campbell | |
| 3,031,747 A | 5/1962 | Green | |
| 3,540,218 A | 11/1970 | Finn | |
| 3,729,807 A | 5/1973 | Fujiwara | |
| 3,747,628 A | 7/1973 | Holster et al. | |
| 3,860,949 A | 1/1975 | Stoeckert et al. | |
| 4,005,454 A | 1/1977 | Froloff et al. | |
| 4,019,388 A | 4/1977 | Hall, II et al. | |
| 4,023,725 A | 5/1977 | Ivett et al. | |
| 4,100,236 A | 7/1978 | Gordon et al. | |
| 4,152,540 A | 5/1979 | Duncan et al. | |
| 4,181,249 A | 1/1980 | Peterson et al. | |
| 4,298,023 A | 11/1981 | McGinnis | |
| 4,341,816 A | 7/1982 | Lauterbach et al. | |
| 4,354,527 A | 10/1982 | McMillan | |
| 4,434,813 A | 3/1984 | Mon | |
| 4,476,893 A | 10/1984 | Schwelm | |
| 4,543,875 A | 10/1985 | Imhof | |
| 4,581,624 A | 4/1986 | O'Connor | |
| 4,593,719 A | 6/1986 | Leonard et al. | |
| 4,628,576 A | 12/1986 | Giachino et al. | |
| 4,647,013 A | 3/1987 | Giachino et al. | |
| 4,661,835 A | 4/1987 | Gademann et al. | |
| 4,687,419 A | 8/1987 | Suzuki et al. | |
| 4,772,935 A | 9/1988 | Lawler et al. | |
| 4,821,997 A | 4/1989 | Zdeblick | |
| 4,824,073 A | 4/1989 | Zdeblick | |
| 4,826,131 A | 5/1989 | Mikkor | |
| 4,828,184 A | 5/1989 | Gardner et al. | |
| 4,869,282 A | 9/1989 | Sittler et al. | |
| 4,938,742 A | 7/1990 | Smits | |
| 4,943,032 A | 7/1990 | Zdeblick | |
| 4,946,350 A | 8/1990 | Suzuki et al. | |
| 4,959,581 A | 9/1990 | Dantlgraber | |
| 4,966,646 A | 10/1990 | Zdeblick | |
| 5,000,009 A | 3/1991 | Clanin | |
| 5,029,805 A | 7/1991 | Albarda et al. | |
| 5,037,778 A | 8/1991 | Stark et al. | |
| 5,050,838 A | 9/1991 | Beatty et al. | |
| 5,054,522 A | 10/1991 | Kowanz et al. | |
| 5,058,856 A | 10/1991 | Gordon et al. | |
| 5,061,914 A | 10/1991 | Busch et al. | |
| 5,064,165 A | 11/1991 | Jerman | |
| 5,065,978 A | 11/1991 | Albarda et al. | |
| 5,066,533 A | 11/1991 | America et al. | |
| 5,069,419 A | 12/1991 | Jerman | |
| 5,074,629 A | 12/1991 | Zdeblick | |
| 5,082,242 A | 1/1992 | Bonne et al. | |
| 5,096,643 A | 3/1992 | Kowanz et al. | |
| 5,116,457 A | 5/1992 | Jerman | |
| 5,131,729 A | 7/1992 | Wetzel | |
| 5,133,379 A | 7/1992 | Jacobsen et al. | |
| 5,142,781 A | 9/1992 | Mettner et al. | |
| 5,161,774 A | 11/1992 | Engelsdorf et al. | |
| 5,169,472 A | 12/1992 | Goebel | |
| 5,176,358 A | 1/1993 | Bonne et al. | |
| 5,177,579 A | 1/1993 | Jerman | |
| 5,178,190 A | 1/1993 | Mettner | |
| 5,179,499 A | 1/1993 | MacDonald et al. | |
| 5,180,623 A | 1/1993 | Ohnstein | |
| 5,197,517 A | 3/1993 | Perera | |
| 5,209,118 A | 5/1993 | Jerman | |
| 5,215,244 A | 6/1993 | Buchholz et al. | |
| 5,216,273 A | 6/1993 | Doering et al. | |
| 5,217,283 A | 6/1993 | Watanabe | |
| 5,222,521 A | 6/1993 | Kihlberg | |
| 5,238,223 A | 8/1993 | Mettner et al. | |
| 5,244,537 A | 9/1993 | Ohnstein | |
| 5,267,589 A | 12/1993 | Watanabe | |
| 5,271,431 A | 12/1993 | Mettner et al. | |
| 5,271,597 A | 12/1993 | Jerman | |
| 5,309,943 A | 5/1994 | Stevenson et al. | |
| 5,323,999 A | 6/1994 | Bonne et al. | |
| 5,325,880 A | 7/1994 | Johnson et al. | |
| 5,333,831 A | 8/1994 | Barth et al. | |
| 5,336,062 A | 8/1994 | Richter | |
| 5,355,712 A | 10/1994 | Petersen et al. | |
| 5,368,704 A | 11/1994 | Madou et al. | |
| 5,375,919 A | 12/1994 | Furuhashi | |
| 5,400,824 A | 3/1995 | Gschwendtner et al. | |
| 5,417,235 A | 5/1995 | Wise et al. | |
| 5,445,185 A | 8/1995 | Watanabe et al. | |
| 5,458,405 A | 10/1995 | Watanabe | |
| 5,543,349 A | 8/1996 | Kurtz et al. | |
| 5,553,790 A | 9/1996 | Findler et al. | |
| 5,566,703 A | 10/1996 | Watanabe et al. | |
| 5,577,533 A | 11/1996 | Cook, Jr. | |
| 5,589,422 A * | 12/1996 | Bhat | 438/476 |
| 5,611,214 A | 3/1997 | Wegeng et al. | |
| 5,785,295 A | 7/1998 | Tsai | |
| 5,810,325 A | 9/1998 | Carr | |
| 5,838,351 A | 11/1998 | Weber | |
| 5,848,605 A | 12/1998 | Bailey et al. | |
| 5,856,705 A | 1/1999 | Ting | |
| 5,873,385 A | 2/1999 | Bloom et al. | |
| 5,908,098 A | 6/1999 | Gorman et al. | |
| 5,909,078 A | 6/1999 | Wood et al. | |
| 5,926,955 A | 7/1999 | Kober | |
| 5,941,608 A | 8/1999 | Campau et al. | |
| 5,954,079 A | 9/1999 | Barth et al. | |
| 5,955,817 A | 9/1999 | Dhuler et al. | |
| 5,970,998 A | 10/1999 | Talbot et al. | |
| 5,994,816 A | 11/1999 | Dhuler et al. | |
| 6,019,437 A | 2/2000 | Barron et al. | |
| 6,023,121 A | 2/2000 | Dhuler et al. | |
| 6,038,928 A | 3/2000 | Maluf et al. | |
| 6,041,650 A | 3/2000 | Swindler et al. | |
| 6,096,149 A | 8/2000 | Hetrick et al. | |
| 6,105,737 A | 8/2000 | Weigert et al. | |
| 6,114,794 A | 9/2000 | Dhuler et al. | |
| 6,116,863 A | 9/2000 | Ahn et al. | |
| 6,123,316 A | 9/2000 | Biegelsen et al. | |
| 6,124,663 A | 9/2000 | Haake et al. | |
| 6,171,972 B1 | 1/2001 | Mehregany et al. | |
| 6,182,742 B1 | 2/2001 | Takahashi et al. | |
| 6,224,445 B1 | 5/2001 | Neukermans et al. | |
| 6,255,757 B1 | 7/2001 | Dhuler et al. | |
| 6,279,606 B1 | 8/2001 | Hunnicutt et al. | |
| 6,283,441 B1 | 9/2001 | Tian | |
| 6,318,101 B1 | 11/2001 | Pham et al. | |
| 6,321,549 B1 | 11/2001 | Reason et al. | |
| 6,386,507 B2 | 5/2002 | Dhuler et al. | |
| 6,390,782 B1 | 5/2002 | Booth et al. | |
| 6,408,876 B1 | 6/2002 | Nishimura et al. | |
| 6,494,804 B1 | 12/2002 | Hunnicutt et al. | |
| 6,505,811 B1 | 1/2003 | Barron et al. | |
| 6,520,197 B2 | 2/2003 | Deshmukh et al. | |
| 6,523,560 B1 | 2/2003 | Williams et al. | |
| 6,533,366 B1 | 3/2003 | Barron et al. | |
| 6,540,203 B1 | 4/2003 | Hunnicutt | |
| 6,581,640 B1 | 6/2003 | Barron | |
| 6,637,722 B2 | 10/2003 | Hunnicutt | |
| 6,662,581 B2 | 12/2003 | Hirota et al. | |
| 6,694,998 B1 | 2/2004 | Hunnicutt | |
| 6,724,718 B1 | 4/2004 | Shinohara et al. | |
| 6,755,761 B2 | 6/2004 | Hunnicutt et al. | |
| 6,761,420 B2 | 7/2004 | Maluf et al. | |
| 6,845,962 B1 | 1/2005 | Barron et al. | |
| 6,872,902 B2 | 3/2005 | Cohn et al. | |
| 6,902,988 B2 | 6/2005 | Barge et al. | |
| 6,958,255 B2 | 10/2005 | Khuri-Yakub et al. | |
| 6,966,329 B2 | 11/2005 | Liberfarb | |
| 7,011,378 B2 | 3/2006 | Maluf et al. | |

(56) References Cited

U.S. PATENT DOCUMENTS

| | | |
|---|---|---|
| 7,063,100 B2 | 6/2006 | Liberfarb |
| 7,210,502 B2 | 5/2007 | Fuller et al. |
| 7,367,359 B2* | 5/2008 | Maluf et al. .......... 137/831 |
| 7,372,074 B2 | 5/2008 | Milne et al. |
| 7,449,413 B1 | 11/2008 | Achuthan et al. |
| 7,528,689 B2 | 5/2009 | Lee et al. |
| 8,113,448 B2 | 2/2012 | Keating |
| 8,113,482 B2 | 2/2012 | Hunnicutt |
| 8,156,962 B2 | 4/2012 | Luckevich |
| 2002/0014106 A1 | 2/2002 | Srinivasan et al. |
| 2002/0029814 A1 | 3/2002 | Unger et al. |
| 2002/0096421 A1 | 7/2002 | Cohn et al. |
| 2002/0174891 A1 | 11/2002 | Maluf et al. |
| 2003/0061889 A1 | 4/2003 | Tadigadapa et al. |
| 2003/0098612 A1 | 5/2003 | Maluf et al. |
| 2003/0159811 A1 | 8/2003 | Nurmi |
| 2003/0206832 A1 | 11/2003 | Thiebaud et al. |
| 2004/0115905 A1* | 6/2004 | Barge et al. .......... 438/473 |
| 2005/0121090 A1 | 6/2005 | Hunnicutt |
| 2005/0200001 A1 | 9/2005 | Joshi et al. |
| 2005/0205136 A1 | 9/2005 | Freeman |
| 2006/0017125 A1 | 1/2006 | Lee et al. |
| 2006/0067649 A1 | 3/2006 | Tung et al. |
| 2006/0218953 A1 | 10/2006 | Hirota |
| 2007/0251586 A1 | 11/2007 | Fuller et al. |
| 2007/0289941 A1 | 12/2007 | Davies |
| 2008/0028779 A1 | 2/2008 | Song |
| 2008/0042084 A1 | 2/2008 | Fuller |
| 2008/0072977 A1 | 3/2008 | George et al. |
| 2008/0229770 A1 | 9/2008 | Liu |
| 2008/0271788 A1 | 11/2008 | Matsuzaki et al. |
| 2009/0123300 A1 | 5/2009 | Uibel |
| 2009/0186466 A1 | 7/2009 | Brewer |
| 2010/0019177 A1 | 1/2010 | Luckevich |
| 2010/0038576 A1 | 2/2010 | Hunnicutt |
| 2010/0204840 A1 | 8/2010 | Sun et al. |
| 2010/0225708 A1 | 9/2010 | Peng et al. |
| 2012/0000550 A1 | 1/2012 | Hunnicutt et al. |

FOREIGN PATENT DOCUMENTS

| | | |
|---|---|---|
| DE | 3401404 | 7/1985 |
| DE | 4101575 | 7/1992 |
| DE | 4417251 | 11/1995 |
| DE | 4422942 | 1/1996 |
| EP | 250948 | 1/1988 |
| EP | 261972 | 3/1988 |
| EP | 1024285 | 8/2000 |
| GB | 2238267 | 5/1991 |
| JP | Sho 39-990 | 2/1964 |
| JP | 04-000003 | 1/1992 |
| JP | 06-117414 | 4/1994 |
| JP | 2000-187041 | 7/2000 |
| JP | 2001184125 | 7/2001 |
| JP | 2001-281265 | 10/2001 |
| JP | 2003-049933 | 2/2003 |
| JP | Sho 63-148062 | 7/2003 |
| JP | 2006-080194 | 3/2006 |
| WO | 99/16096 A1 | 4/1999 |
| WO | 99/24783 A1 | 5/1999 |
| WO | 00/14415 A2 | 3/2000 |
| WO | 00/14415 A3 | 7/2000 |
| WO | 2005/084211 A2 | 9/2005 |
| WO | 2005/084211 A3 | 1/2006 |
| WO | 2006/076386 A1 | 7/2006 |
| WO | 2008/076388 A1 | 6/2008 |
| WO | 2008/076388 B1 | 8/2008 |
| WO | 2008/121365 A1 | 10/2008 |
| WO | 2008/121369 A1 | 10/2008 |
| WO | 2010/019329 A2 | 2/2010 |
| WO | 2010/019329 A3 | 2/2010 |
| WO | 2010/019665 A2 | 2/2010 |
| WO | 2010/019665 A3 | 2/2010 |
| WO | 2010/065804 A2 | 6/2010 |
| WO | 2010/065804 A3 | 6/2010 |
| WO | 2011/022267 A2 | 2/2011 |
| WO | 2011/022267 A3 | 2/2011 |
| WO | 2011/094300 A2 | 8/2011 |
| WO | 2011/094300 A3 | 8/2011 |
| WO | 2011/094302 A2 | 8/2011 |
| WO | 2011/094302 A3 | 8/2011 |

OTHER PUBLICATIONS

Hikaru Kobayashi Asuha, Osamu Maida, Masao Takahashi, and Hitoo Iwasa, Nitric acid oxidation of Si to form ultrathin silicon dioxide layers with a low leakage current density, 2003, Journal of Applied Physics, 94, 7328.*

Scott Clark, Etching Silicon Dioxide with Aqueous HF Solutions, Copyright 1998-2000, Bold Technologies Inc., http://www.bold-tech.com/technical/silicon_dioxide.htm.*

Chunbo Zhang and Khalil Najafi, Fabrication of thick silicon dioxide layers for thermal isolation, 2004, J. Micromech. Microeng. 14 769-774.*

PCT International Search Report and the Written Opinion, PCT/US2011/022565 filed Jan. 26, 2011, dated Jan. 28, 2010, AM0036.

PCT International Search Report and the Written Opinion, PCT/US2011/022563 filed Jan. 26, 2011, dated Jan. 28, 2010, AM0032.

Ayon et al., "Etching Characteristics and Profile Control in a Time Multiplexed ICP Etcher," Proc. of Solid State Sensor and Actuator Workshop Technical Digest, Hilton Head SC, (Jun. 1998) 41-44.

Bachmann, Stephan, "Electronic Expansion Valves: Fitters Notes (Part 8)", Danfoss Fitters Notes, Jul. 2008.

Bartha et al., "Low Temperature Etching of Si in High Density Plasma Using SF6/02," Microelectronic Engineering, and Actuator Workshop Technical Digest, Hilton Head SC, (Jun. 1998) 41-44.

Biography, Ohio State University Website [online], [retrieved Dec. 31, 2000]. Retrieved from the Internet <URL: http://www.chemistry.ohio-state.edu/resource/pubs/brochure/madou.htm>.

Booth, Steve and Kaina, Rachid, Fluid Handling—Big Gains from Tiny Valve, Appliance Design (Apr. 2008), pp. 46-48.

Changenet et al., "Study on predictive functional control of an expansion valve for controlling the evaporator superheat", Proc.IMechE vol. 222 Part I, May 28, 2008, pp. 571-582.

Controls Overview for Microstaq Silicon Expansion Valve (SEV), Rev. 1, Dec. 2008 [online], [retrieved May 17, 2010]. Retrieved from the Internet <URL: http://www.microstaq.com/pdf/SEV_controls.pdf>.

Copeland, Michael V., Electronic valves promise big energy savings, Fortune, Sep. 9, 2008 [online], [retrieved Sep. 9, 2008]. Retrieved from the internet <URL: http://techland.blogs.fortune.cnn.com/2008/09/09/electronic-valves-promise-big-energy-savings>.

Fung et al., "Deep Etching of Silicon Using Plasma" Proc. Of the Workshop on Micromachining and Micropackaging of Transducers, (Nov. 7-8, 1984) pp. 159-164.

Gui, C. et al, "Selective Wafer Bonding by Surface Roughness Control", Journal of The Electrochemical Society, 148 (4) G225-G228 (2001).

Gui, C. et al., "Fusion bonding of rough surfaces with polishing technique for silicon micromachining", Microsystem Technologies (1997) 122-128.

Günther, Götz, "Entwicklung eines pneumatischen 3/2-Wege-Mikroventils", O + P Olhydraulik Und Pneumatik, Vereinigte Fachverlage, Mainz, DE, vol. 42, No. 6, Jun. 1, 1998, pp. 396-398, XP000831050, ISSN: 0341-2660.

Higginbotham, Stacey, Microstaq's Tiny Valves Mean Big Energy Savings [online], [retrieved Dec. 8, 2008]. Retrieved from the Internet <URL: http//earth2tech.com/2008/09/09/microstaqs-tiny-valves-mean-big-energysavings (posted Sep. 9, 2008)>.

J. Mark Noworolski, et al.,"Process for in-plane and out-of-plane single-crystal-silicon thermal microactuators", Sensors and Actuators A 55 (1996); pp. 65-69.

Jonsmann et al., "Compliant Electra-thermal Microactuators", IEEE Technical Digest , Twelfth IEEE International Conference on Micro Electro Mechanical Systems Jan. 17-21, 1999, Orlando, Florida, pp. 588-593, IEEE Catalog No. 99CH36291C.

(56) References Cited

OTHER PUBLICATIONS

K.R. Williams et al., "A Silicon Microvalve for the Proportional Control of Fluids", Transducers '99, Proc. 10th International Conference on Solid State Sensors and Actuators, held Jun. 7-10, 1999, Sendai, Japan, pp. 18-21.
Keefe, Bob, Texas firm says value-replacing chip can drastically cut energy use, Atlanta Metro News, Sep. 10, 2008 [online], [retrieved Sep. 10, 2008]. Retrieved from the Internet <URL: http://www.ajc.com/search/content/shared/money/stories/2008/09/microstaq10_cox-F9782.html>.
Klaassen et al., "Silicon Fusion Bonding and Deep Reactive Ion Etching; A New Technology for Microstructures," Proc., Transducers 95 Stockholm Sweden, (1995) 556-559.
Linder et al., "Deep Dry Etching Techniques as a New IC Compatible Tool for Silicon Micromachining," Proc, Transducers, vol. 91, (Jun. 1991) pp. 524-527.
Luckevich, Mark, MEMS microvlaves: the new valve world, Valve World (May 2007), pp. 79-83.
Madou, Marc, "Fundamentals of Microfabrication", Boca Raton: CRC Press, 1997, 405-406.
MEMS, Microfluidics and Microsystems Executive Review [online], Posted Apr. 16, 2009. [retrieved May 17, 2010]. Retrieved from the Internet <URL: http:www.memsinvestorjournal.com/2009/04/mems-applications-for-flow-control-.html>.
Microstaq Announces High Volume Production of MEMS-Based Silicon Expansion Valve [onlne], [retrieved Jan. 27, 2010]. Retrieved from the Internet <URL: http://www.earthtimes.org/articles/printpressstory.php?news+1138955 (posted Jan. 27, 2010)>.
Microstaq Product Descriptions, SEV, CPS-4, and PDA-3 [online], Published 2009, [retrieved May 17, 2010]. Retrieved from the Internet <URL: http://www.microstaq.com/products/index.html>.
Microstaq Product Description, Proportional Piloted Silicon Control Valve (CPS-4) [online], Published 2008, [retrieved May 17, 2010]. Retrieved from the Internet <URL: http://www.microstaq.com/products/cps4.html>.
Microstaq Product Description, Proportional Direct Acting Silicon Control Valve (PDA-3) [online], Published 2008, [retrieved May 17, 2010]. Retrieved from the Internet <URL: http://www.microstaq.com/products/pda3.html>.
Microstaq Technology Page [online], Published 2008, [retrieved May 17, 2010]. Retrieved from the Internet <URL: http://www.microstaq.com/technology/index.html>.
Petersen et al. "Surfaced Micromachined Structures Fabricated with Silicon Fusion Bonding" Proc., Transducers 91, (Jun. 1992) pp. 397-399.
Press Release, Freescale and Microstaq Join Forces on Smart Superheat Control System for HVAC and Refrigeration Efficiency (posted Jan. 22, 2008) [online], [retrieved May 17, 2010]. Retrieved from the Internet <URL: http://www.microstaq.com/pressReleases/prDetail_04.html>.
Press Release, Microstaq Unveils Revolutionary Silicon Expansion Valve at Demo 2008 [online], [retrieved May 17, 2010]. Retrieved from the Internet <URL: http://www.microstaq.com/pressReleases/prDetail_05.html (posted Sep. 8, 2008)>.
Press Release, Microstaq Mastering Electronic Controls for Fluid-Control Industry (posted May 5, 2005) [online[, [retrieved May 17, 2010]. Retrieved from the Internet <URL: http://www.microstaq.com/pressReleases/prDetail_02.html>.
Press Release, Nanotechnology Partnerships, Connections Spur Innovation for Fluid Control Industries (posted Jun. 9, 2005) [online], [retrieved May 17, 2010]. Retrieved from the Internet <URL: http://www.microstaq.com/pressReleases/prDetail_03.html>.
Product Review, greentechZONE Products for the week of May 18, 2009 [online], [retrieved May 17, 2010]. Retrieved from the Internet <URL: http://www.en-genius.net/site/zones/greentechZONE/product_reviews/grnp_051809>.
SEV Installation Instructions [online], [retrieved May 17, 2010]. Retrieved from the Internet <URL: http://www.microstaq.com/pdf/SEV_Instruction_sheet.pdf>.
Silicon Expansion Valve Information Sheet [online], [retrieved May 17, 2010]. Retrieved from the Internet <URL: http://www.microstaq.com/pdf/SEV_Infosheet_2_0.pdf>.
Silicon Expansion Valve (SEV)—For Heating, Cooling, and Refrigeration Applications [online], [retrieved May 17, 2010]. Retrieved from the Internet <URL: http://www.microstaq.com/pdf/SEV_Quicksheet.pdf>.
Silicon Expansion Valve Data Sheet [online], [retrieved May 17, 2010]. Retrieved from the Internet <URL: http://www.microstaq.com/pdf/SEV_Datasheet_1_8.pdf>.
SMIC Announces Successful Qualification of a MEMS Chip for Microstaq (posted Oct. 26, 2009) [online], [retrieved May 17, 2010]. Retrieved from the Internet <URL: http://www.prnewswire.com/news-releases/smic-announces-successful-qualification-of-a-mems-chip-for-microstaq-65968252.html (posted Oct. 26, 2009)>.
SMIC quals Microstaq MEMS chip for fluid control (posted Oct. 26, 2009) [online], [retrieved May 17, 2010]. Retrieved from the Internet <URL: http://www.electroiq.com/ElectroiQ/en-us/index/display/Nanotech_Article_Tools_Template.articles.small-times.nanotechmems.mems.microfluidics.2009.10.smic-quals_microstaq.html>.
Tiny Silicon Chip Developed by Microstaq Will Revolutionize Car Technology (posted May 19, 2005) [online], [retrieved May 19, 2005]. Retrieved from the Internet <URL: http://www.nsti.org/press/PRshow.html?id=160>.
Turpin, Joanna R., Soft Economy, Energy Prices Spur Interest in Technologies [online], Published Dec. 8, 2008. [retrieved May 18, 2010]. Retrieved from the Internet <URL: http://www.achrnews.com/copyright/BNP_GUID_9-5-2006_A_10000000000000483182>.
Uibel, Jeff, The Miniaturization of Flow Control (Article prepared for the 9th International Symposium on Fluid Control Measurement and Visualization (FLUCOME 2007)), Journal of Visualization (vol. 11, No. 1, 2008), IOS Press.
Yunkin et al., "Highly Anisotropic Selective Reactive Ion Etching of Deep Trenches in Silicon," Microelectronic Engineering, Elsevier Science B.V., vol. 23, (1994) pp. 373-376.
Zhixiong Liu et al., "Micromechanism fabrication using silicon fusion bonding", Robotics and Computer Integrated Manufacturing 17 (2001) 131-137.
Chinese First Office Action, Application No. CN 201180007647.1, dated Aug. 4, 2014.

* cited by examiner

PROCESS FOR RECONDITIONING SEMICONDUCTOR SURFACE TO FACILITATE BONDING

BACKGROUND OF THE INVENTION

This invention relates in general to valves and to semiconductor electromechanical devices, and in particular, to micromachined components formed from layers of a semiconductor material, such as silicon, bonded together.

MEMS (micro electro mechanical systems) are a class of systems that are physically small, having features or clearances with sizes in the micrometer range or smaller (i.e., smaller than about 10 microns). These systems have both electrical and mechanical components. The term "micro machining" is commonly understood to mean the production of three-dimensional structures and moving parts of MEMS devices. MEMS originally used modified integrated circuit (e.g., computer chip) fabrication techniques (such as chemical etching) and materials (such as silicon semiconductor material) to micro machine these very small mechanical devices. Today there are many more micro machining techniques and materials available. The term "MEMS device" as may be used in this application means a device that includes a micro machined component having features or clearances with sizes in the micrometer range, or smaller (i.e., smaller than about 10 microns). It should be noted that if components other than the micro machined component are included in the MEMS device, these other components may be micro machined components or standard sized (i.e., larger) components. Similarly, the term "microvalve" as may be used in this application means a valve having features or clearances with sizes in the micrometer range, or smaller (i.e., smaller than about 10 microns) and thus by definition is at least partially formed by micro machining. The term "microvalve device" as may be used in this application means a device that includes a microvalve, and that may include other components. It should be noted that if components other than a microvalve are included in the microvalve device, these other components may be micro machined components or standard sized (i.e., larger) components.

Many MEMS devices may be made of multiple layers (or substrates) of material, which may be micromachined to form components of the MEMS device prior to assembly of the multiple layers into a completed MEMS device. For example, such a MEMS device may be manufactured using suitable MEMS fabrication techniques, such as the fabrication techniques disclosed in U.S. Pat. No. 6,761,420, the disclosures of which are incorporated herein by reference; U.S. Pat. No. 7,367,359, the disclosures of which are incorporated herein by reference; Klassen, E. H. et al. (1995). "Silicon Fusion Bonding and Deep Reactive Ion Etching: A New Technology for Miscrostructures," Proc. Transducers 95 Stockholm Sweden pp. 556-559, the disclosures of which are incorporated herein by reference; and Petersen, K. E. et al. (June 1991). "Surface Micromachined Structures Fabricated with Silicon Fusion Bonding," Proceedings, Transducers' 91 pp. 397-399, the disclosures of which are incorporated herein by reference.

SUMMARY OF THE INVENTION

The invention relates to a method to facilitate bonding of semiconductor components, such as silicon wafers, that have micro structural defects on a bonding interface surface, for example due to exposure to wet or dry chemical micromachining processes while creating structures on or in the semiconductor material. Many bonding processes require that a substrate bonding interface surface be substantially free of defects to facilitate the bonding of the surface to the surface of another substrate with highly reliable bonding strength. Fusion bonding is a process that is particularly susceptible to bond failure due to poor surface quality. Semiconductor wafers that have undergone extensive micromachining processes may have bonding interface surfaces that have micro structural defects caused by these micromachining processes. In a novel method, wafers which have such defects in interface surfaces, and which otherwise might have to be discarded as scrap, may be reconditioned to remove these defects using a non-abrading process. One example of such a non-abrading process in a method which includes forming an oxide layer (such as a silicon dioxide layer) on the bonding interface surface to a depth below the level of the defect, and then removing the oxide or silicon dioxide layer to expose a satisfactory surface for bonding, thereby increasing line yield and reducing scrap triggers in fabrication facilities.

Various aspects of this invention will become apparent to those skilled in the art from the following detailed description of the preferred embodiment, when read in light of the accompanying drawings.

DETAILED DESCRIPTION OF THE PREFERRED EMBODIMENT

Figure 1:
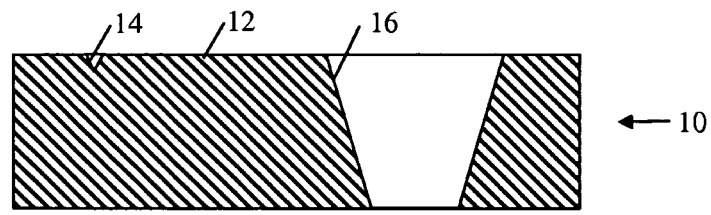
FIG. 1 is a non-scale cross-sectional view of a MEMS device component formed of a semiconductor material, and having a micro structural defect in a bonding interface surface thereof.

Referring now to the drawings, there is illustrated in FIG. 1 a portion of a first component, indicated generally at 10. The component 10 is formed of a semiconductor material, such as single crystal silicon or other suitable semiconductor material. The component 10 includes a bonding interface surface 12. A second component (not shown) is to be bonded to the bonding interface surface 12 of the component 10 during manufacture of a composite device. The component 10 could be, for example, a substrate or layer of a multi-layer MEMS device, or a surface mounted component to be bonded to a larger substrate.

A micro structural defect 14 exists on the bonding interface surface 12. A micro structural defect is defined in this application as being a surface defect, such as a surface pit, or scratch extending into the bonding interface surface. Micro structural defects will typically be on the order of about 2 microns or less deep; note that the depth of a defect which may be treated according to the non-abrading methods described herein may vary according to a variety of factors such as the particular material from which the component 10 is composed, the thickness of the component 10 and the required thickness of the component 10, the economics of scrapping parts versus refurbishing bonding interface surface 12 of the component 10; accordingly, the definition of a micro structural defect is not tied to a precise numerical value of the depth. Various ways this micro structural defect 14 might have been created include, for example, scratching of the bonding interface surface 12 during handling of the component 10, or as a result of exposure of the bonding interface surface 12 to wet or dry chemical micromachining processes while creating micromachined features 16 on or in the semiconductor material of the component 10.

Many bonding processes require that a bonding interface surface be substantially free of defects to facilitate the bonding of the bonding interface surface 12 to a bonding interface surface of another component with highly reliable bonding strength. Fusion bonding is a process that is particularly susceptible to bond failure due to poor surface quality. If the micro structural defect 14 in the bonding interface surface 12 were, for example, on an otherwise featureless semiconductor wafer, then perhaps the wafer could be reconditioned utilizing a known abrading method, that is, a method mechanically removing material from the wafer such as by cutting, grinding, or polishing the bonding interface surface 12 to uniformly remove material from the bonding interface surface 12 to a depth below the micro structural defect 14. One such abrading method is the Chemical Mechanical Polishing (CMP) method disclosed in *Fusion Bonding of Rough Surfaces With Polishing Technique for Silicon Micromachining*, C. Gui et al., *Microsystem Technologies* (1997), pp. 122-128 (copyright 1997 Springer-Verlag), the disclosures of which are incorporated herein by reference. However, instead of utilizing conventional abrading methods to smooth the component 10, or scrapping the component 10 in the alternative, it is contemplated that inventive non-abrading methods (i.e., methods of removing material from the component 10 other than mechanical removal) may be utilized to remove the micro structural defect 13. The inventive methods described below are especially useful when the component 10 has already been micromachined to create structures 16 in the component 10, where abrading methods of removing defects, such as polishing of the bonding interface surface 12, would damage such micromachined structures 16. Such abrading methods may damage the micromachined structures 16, for example, by mechanically overstressing such micromachined structures 16.

Figure 3:
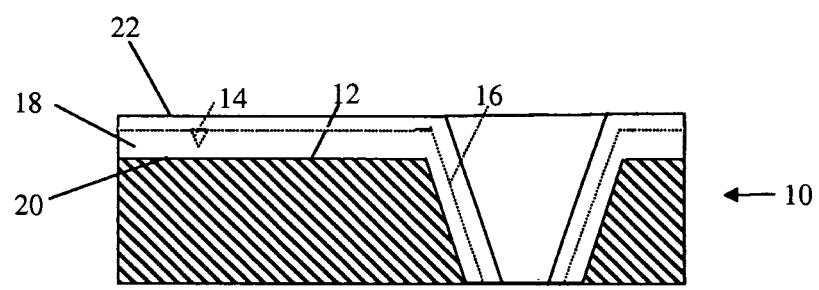
FIG. 3 is a view similar to FIG. 1, showing an oxide layer grown on the bonding interface surface to a depth below the surface defect, according to the method illustrated in FIG. 2.
Figure 4:
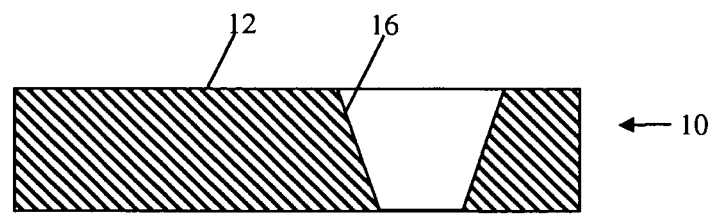
FIG. 4 is a view similar to FIGS. 1 and 3, showing the oxide layer and surface defect removed.
Figure 2:
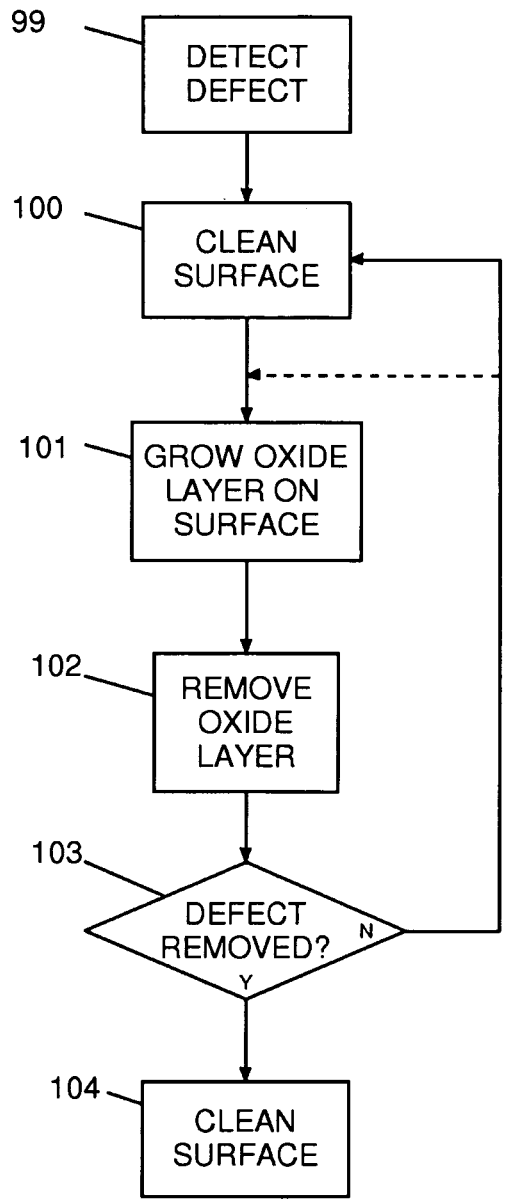
FIG. 2 is a flow chart illustrating a method for reconditioning the bonding interface surface to remove the surface defect and facilitate bonding of the surface with another surface.

Referring now to FIG. 2, a non-abrading method of resurfacing the bonding interface surface 12 is described. The preferred method may be most broadly described as including a step 101, wherein an oxide layer 18 (seen in FIG. 3) is formed on the bonding interface surface 12. The oxide layer 18 may be a layer formed of any suitable oxide (for example, a silicon dioxide layer) formed by oxidizing the semiconductor material of the component 10. The oxide layer 18 will penetrate into the semiconductor material to form an oxide/semiconductor interface 20 below the original level of the bonding interface surface 12. The oxide layer 18 may be thicker than the depth of penetration into the semiconductor material, so that an exterior surface 22 of the oxide layer 18 may be above the original level of the bonding interface surface 12.

In a step 102, the oxide layer 18 is removed, exposing a new bonding interface surface 12'. If the oxide/semiconductor interface 20 was sufficiently below the depth of the micro structural defect 14, then the micro structural defect 14 will have been removed. This completes the basic steps of the method.

However, preferably, the method includes a step 100 (before the step 101) of cleaning the bonding interface surface 12. Cleaning the bonding interface surface 12 helps ensure that the oxide layer 18 grows uniformly on the bonding interface surface 12.

The method may also be considered to include a preliminary evaluation step 99, before step 100, wherein the bonding interface surface 12 is inspected, the micro structural defect 14 is identified, and a decision is made to refurbish the component 10 rather than to scrap the component 10.

The method also may be considered to include a reevaluation step 103, wherein the new bonding interface surface 12' is inspected to verify that the bonding interface surface 12' is substantially defect free. If it is not, then steps 100, 101, and 102 can be repeated, growing and removing additional oxide layers until the bonding interface surface 12' is substantially defect free.

Once the refurbished bonding interface surface 12' is substantially defect free, the surface 12' is preferably cleaned in a step 104 to completely remove remnants from the previous oxide layer removal step 102.

The processes utilized to accomplish the method illustrated in FIG. 2 may be varied according to a variety of factors. Generally, these can be broken into two classes: Surface reconditioning methods conducted at relatively high temperatures (for semiconductor components 10 with no features which may be damaged at such relatively high temperatures, such as metal plated, bonded, or adhered to the component, or polymer coatings), and surface reconditioning methods conducted at relatively low temperatures.

A non-abrading process for reconditioning the bonding interface surface 12 of the component 10 at relatively high temperatures will now be described, elaborating on the steps illustrated in FIG. 2. Note that if the semiconductor material from which the component 10 is made is silicon, thermal oxidation of silicon is usually performed at a temperature between about 800° C. and 1200° C., resulting in so called High Temperature Oxide layer (HTO). It may use either water vapor (steam) or molecular oxygen as the oxidant; it is consequently called either wet or dry oxidation.

According to this high temperature method, the step 100 includes cleaning the bonding interface surface 12 with the micro structural defect 14 utilizing standard wafers cleaning methods, for example (without limitation) "SC1/SC2". SC1 is an abbreviation for Standard Clean Solution #1; SC2 is an abbreviation for Standard Clean Solution #2. Their names are derived from the original wafer cleaning process developed at RCA Laboratories circa 1970. This process included a sequence of cleaning steps using "standard" solutions SC1 and SC2 to clean a wafer. SC1 consists of a mixture of ammonium hydroxide (NH4OH), hydrogen peroxide (H2O2), and DI water (deionized H2O). Once suitable concentration ratio for the SC1 mix is 1:4:20 NH4OH:H2O2:H2O, although other ratios have been used. SC2 consists of a mixture of hydrochloric acid (HCl), hydrogen peroxide (H2O2), and DI water (H2O). A typical concentration ratio for the SC2 mix is 1:1:5 HCl:H2O2:H2O (that is, 1 part HCl, 1 part H2O2, with 5 parts H2O). SC1 and SC2 are utilized to remove different types of contamination from the components being cleaned. Use of the SC2 solution usually follows the use of the SC1 solution in the RCA sequence.

The step 101 includes placing the component 10 in a wet/dry thermal oxidation chamber and growing the oxide layer 18 to a thickness of anywhere between a sub-micron thickness to an about 2 micron thickness. During the oxidation process the surface damage (micro structural defect 14) is consumed by the oxide growth process).

The step 102 includes removing the component 10 from the furnace (thermal oxidation chamber) once the desired oxide thickness is achieved, and utilizing a suitable method, such as a wet oxide strip method, to remove the oxide layer 18. Depending upon the material from which the semiconductor component 10 is formed, such a suitable method may include the application of a suitable oxide removal etchant, such as dilute hydrofluoric acid, buffered oxide etch, vapor hydrofluoric acid, or oxide removing chemical agents.

The step 103 includes inspecting the bonding interface surface 12 to determine if the micro structural defect 14 was completely consumed by the oxide growth process in Step 101. If surface damage (such as a remaining portion of the micro structural defect 14) still exists, repeat steps 100, 101, and 102 as necessary; however, large surface damage may mean that the component 10 is not able to be economically salvaged regardless of the number of repetitions of steps 100, 101, and 102. For example, in some applications, it is believed that the use of this procedure may be limited to micro structural defects up to 2 microns in depth for cost considerations, however it is anticipated that larger defects could be removed if required.

The step 104 includes cleaning the reconditioned component 10 with standard wafer cleaning methods, for example "SC1/SC2" described above. The component 10 can then be further processed as desired. For example, the bonding interface surface 12 can be bonded to the bonding interface surface of another component; if desired, before bonding the bonding interface surface 12 can be exposed to a desired bonding interface surface chemistry to facilitate the desired bonding process.

As discussed above, a non-abrading low temperature method for reconditioning the bonding interface surface 12 of the semiconductor component 10 may alternatively be utilized, which process will now be described, again elaborating on the steps illustrated in FIG. 2.

The step 100 includes first cleaning the bonding interface surface 12 of the component 10 with the micro structural defect 14 utilizing standard wafer cleaning methods, for example (without limitation) "SC1/SC2". If suitable (for example, if oxides are present or suspected on the bonding interface surface 12), the step 100 may include a second subsequent sub-step of exposing the component 10 to a suitable oxide removal agent. For example, if the component 10 is formed of silicon, the second sub-step of the step 100 may include exposing the component 10 to vapor hydrofluoric acid or dilute buffered oxide etch. The step 100 may then further include third and fourth sub-steps of, respectively, washing the component 10 in deionized water and drying the component 10.

In the step 101, the component 10 is exposed to a suitable oxidizing agent to grow an oxide layer 18 on the bonding interface surface 12. For example, if the component 10 were made of silicon, the bonding interface surface 12 of the component 10 could be exposed to nitric acid (which might be, for example, at a temperature ranging from a comfortable room temperature to the vaporizing temperature of the nitric acid) (and thus the nitric acid could be either in vapor or liquid form) to promote the growth of a silicon oxide monolayer on the bonding interface surface 12. Note that with this low temperature method, the silicon oxide layer is a monolayer, and may not grow into a relatively thicker (micron range) silicon dioxide layer. Once the area of the silicon exposed to nitric acid forms the silicon oxide monolayer, the oxidation process stops. For non silicon semiconductor material, utilize a suitable oxidizing agent.

The step 102 provides for exposing the oxidized component 10 to a suitable oxide removal agent. This may actually require preparatory sub-steps. For example, if the oxidized component 10 is a silicon semiconductor, as part of such preparatory sub-steps, one may wash the oxidized component 10 in deionized water, dry the oxidized component 10, and then expose the oxidized component 10 to vapor hydrofluoric acid or dilute buffered oxide etch for the removal of the silicon oxide monolayer. For non-silicon components 10, a suitable oxide removal agent may be utilized.

The step 103 is the inspection step to determine if the micro structural defect 14 has been removed. Again this may actually require preparatory sub-steps, such as cleaning the oxidized component 10 in deionized water and drying the oxidized component 10, and then inspecting the bonding interface surface 12 for surface damage. If any of the micro structural defect 14 (or other surface damage) is observed, the process to this point may be repeated as required to completely remove the micro structural defect 14 or other surface damage. Note that due to the relative small thickness of the silicon oxide monolayer 18 achieved in the low temperature process (compared to the thickness of the silicon dioxide type oxide layer 18 that may be generated in the high temperature process described above), normally many more repetitions of forming an oxide layer 18 and removing it may be required compared to the high temperature method. Removing the silicon oxide monolayer 18 re-exposes the silicon layer, and the oxidation and removal process will normally be repeated several times (depending on the dimensions of the micro structural defect 14), until the micro structural defect 14 is removed. It may not be required to perform the cleaning step 100 again, and instead jump straight (as indicated by the dashed flow path on FIG. 2) to repeating the steps 101 and 103 as desired until the surface damage (the micro structural defect 14) is removed.

Once the micro structural defect 14 has been removed (and the component 10 is still usable) the next step is the step 104, clean the reconditioned component 10 with standard wafer cleaning methods, such as (without limitation) "SC1/SC2". The component 10 can then be further processed as desired. For example, the bonding interface surface 12 may be bonded to the bonding interface surface of another component; if desired, before bonding the bonding interface surface 12 can be exposed to a desired bonding interface surface chemistry to facilitate the desired bonding process.

It is noted that although the steps of oxide formation and removal may be required to be performed several times before enough material is removed to eliminate the micro structural defect 14, the low temperature method for reconditioning the bonding interface surface 12 of the semiconductor component 10 can be highly automated utilizing a wet tank dedicated for this process.

It is contemplated that a mixture of non-abrading methods of surface reconditioning may be utilized. For example, in the case of a relatively deep micro structural defect 14, the surface reconditioning method conducted at relatively high temperatures (described above) may be utilized to form and then remove one or more relatively thick oxide layers 18. Then the surface reconditioning method conducted at relatively low temperatures (described above) may be utilized to form and then remove one or more relatively thin oxide layers 18, thereby helping to avoid removing more material than required to remove the micro structural defect 14.

The principles and modes of operation of this invention have been explained and illustrated in its preferred embodiments. However, it must be understood that this invention may be practiced otherwise than as specifically explained and illustrated without departing from its spirit or scope.

What is claimed is:

1. A method of reconditioning a surface of a semiconductor device having a micro structural defect, comprising:

a) identifying a micro structural defect in a surface; and b) utilizing wet chemistry methods to remove material from the surface to a depth below the maximum depth of the micro structural defect.

2. The method of claim 1, where the semiconductor device is made of silicon, and wherein step b) includes the sub-steps:
   b1) exposing the surface to liquid nitric acid to grow an oxide layer on the surface; and
   b2) removing the oxide layer to reveal a surface substantially free of micro structural defects.

3. The method of claim 2 wherein step b2) includes removing the oxide layer using a wet oxide strip method.

4. A method of reconditioning a surface of a microvalve device, comprising:
   a) micromachining a component of a microvalve device from silicon;
   b) identifying a micro structural defect in a surface of the component; and
   c) utilizing a non-abrading wet chemistry method to remove material from the surface to a depth below the maximum depth of the micro structural defect.

5. The method of claim 4, wherein step c) includes the sub-steps:
   c1) applying liquid nitric acid to the surface to grow an oxide layer on the surface below the depth of the micro structural defect; and
   c2) removing the oxide layer using a wet oxide strip method to reveal a surface substantially free of micro structural defects.

6. The method of claim 4, Wherein between step b) and step c), the following intermediate steps are performed:
   x1) forming a high temperature oxide layer on the surface; and
   x2) removing the high temperature oxide layer.

7. A method of fabricating a multi-layer silicon micromachined device, comprising the steps of:
   a) micromachining a first layer of a silicon micromachined device, the first layer having a first bonding interface surface;
   b) micromachining a second layer of the silicon micromachined device, the second layer having a second bonding interface surface for bonding to the first bonding interface surface;
   c) identifying a surface defect in the form of a micro structural defect in at least one of the first bonding interface surface and the second bonding interface surface;
   d) utilizing a non-abrading wet chemistry method to remove material from the in at least one of the first bonding interface surface and the second bonding interface surface to a depth below a maximum depth of the micro structural defect and render in at least one of the first bonding interface surface and the second bonding interface surface satisfactory for fusion bonding; and
   e) fusion bonding the first bonding interface surface to the second bonding interface surface to join the first layer to the second layer of the multi-layer silicon micromachined device.

8. The method of claim 7, wherein the micromachined device is a silicon microvalve.

9. A method of manufacturing a MEMS device with a moving mechanical component, comprising:
   a) micromachining a surface of a component to create a feature, the surface with a feature being a surface of a component part of a MEMS device with a moving mechanical component;
   b) identifying a micro structural defect in the surface with a feature;
   c) utilizing a non-abrasive wet chemistry method to remove material from the surface to a depth below the maximum depth of the micro structural defect;
   d) assembling the component with other components to complete manufacture of the MEMS device with a moving mechanical component.

10. The method of claim 9, wherein the surface was a bond interface surface, and step d) further includes bonding the component to another component of the MEMS device utilizing fusion bonding.

11. The method claim 9, wherein step c) includes utilizing a wet chemistry method to remove material from the surface to a depth below the maximum depth of the micro structural defect.

* * * * *